United States Patent

Keller et al.

[15] 3,649,887

[45] Mar. 14, 1972

[54] AC LINE OPERATION OF MONOLITHIC CIRCUIT

[72] Inventors: Jean-Paul Keller, Neshanic Station; Stefano A. Graf, Somerville, both of N.J.

[73] Assignee: RCA Corporation

[22] Filed: Aug. 11, 1969

[21] Appl. No.: 849,065

[52] U.S. Cl. ........................317/235 R, 317/235 D, 307/303

[51] Int. Cl. ........................H01l 19/00

[58] Field of Search ........................317/235, 234; 307/303

[56] References Cited

UNITED STATES PATENTS

| | | | |
|---|---|---|---|
| 3,541,357 | 11/1970 | Kvam | 307/303 |
| 2,938,130 | 5/1960 | Noll | 317/235 |
| 3,441,815 | 4/1969 | Pollock et al. | 317/235 |
| 3,466,510 | 9/1969 | Maute | 317/235 |
| 3,488,564 | 1/1970 | Crafts | 317/235 |
| 3,509,446 | 4/1970 | Mullaly | 317/235 |
| 3,517,280 | 6/1970 | Rosier | 317/235 |

*Primary Examiner*—Jerry D. Craig
*Attorney*—E. J. Norton

[57] ABSTRACT

An integrated circuit chip is disclosed which can be coupled directly to and operated from a source of AC potential. To prevent conduction between the substrate and epitaxial layer of the chip which otherwise will occur and result in inoperativeness and possible catastrophic failure, a diode is formed between the substrate and one terminal of the AC source, such that the diode is conductive only during half-cycle of one polarity of the AC signal, thereby referencing the substrate to ground or reference potential during that time. During the half cycles of opposite polarity, the substrate is "floating." Means are provided for impairing parasitic device action due to the presence of the additional diode.

5 Claims, 2 Drawing Figures

PATENTED MAR 14 1972 3,649,887

INVENTORS
JEAN-PAUL KELLER &
STEFANO GRAF
BY Harry A. Barron
ATTORNEY

AC LINE OPERATION OF MONOLITHIC CIRCUIT

This invention relates to a circuit which includes an integrated circuit chip, and more particularly, to such a circuit in which the chip can be directly coupled to a source of alternating current (AC) energy.

It is desirable in any circuit to minimize the number of separate components. The advantages include savings in cost, reduced weight and size, and increased reliability.

One obvious way in which these advantages may be realized is through the use of a junction isolated integrated circuit. However, in the prior art, such integrated circuits could only be used in an application in which an external direct current (DC) supply was used. It has not been possible to apply an AC supply of power directly to a junction isolated integrated circuit chip because the isolation junction, which must be reverse biased for proper operation, can be forward biased. The circuit would thus be inoperative and possibly subject to catastrophic failure.

Thus, where one desired to use an integrated circuit to perform any desired function, it was necessary to provide external DC power to the chip by means such as an external battery or external discrete elements connected as an AC to DC converter. This meant more external components, with the accompanying greater cost, weight, size, and decreased reliability.

It is an object of this invention to provide a circuit which includes an integrated circuit chip that may be connected directly to a source of AC energy.

The circuit includes an integrated circuit chip having a substrate of semiconductive material of one type conductivity and a region of conductivity type opposite to that of the substrate positioned such that a first rectifying junction is formed between the region and the substrate. There is also provided a second rectifying junction between one of the terminals of an AC source and the substrate. The second rectifying junction is poled so that it is nonconductive during that half-cycle of the AC signal which otherwise would have rendered the first junction conductive.

Figure 1:
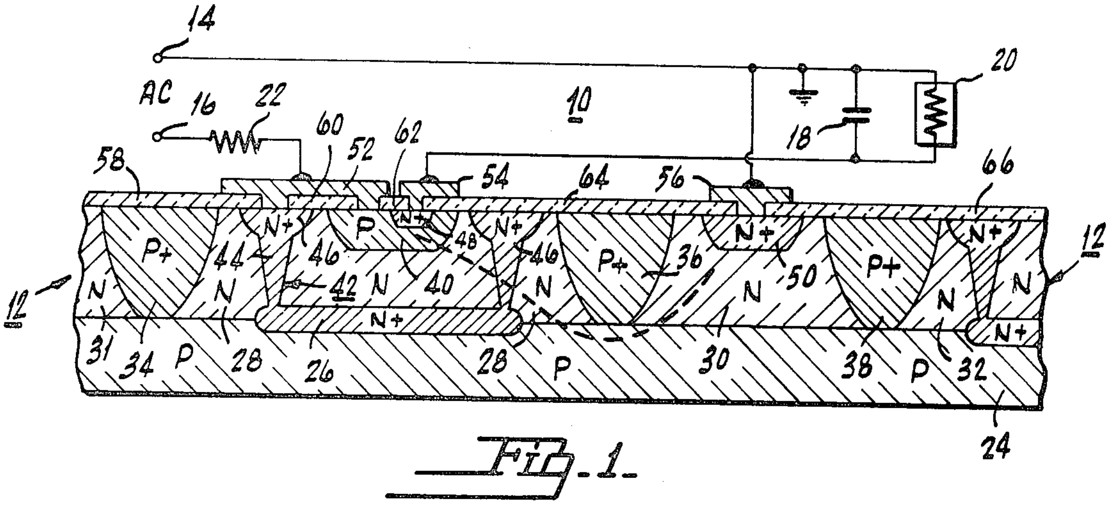
Figure 2:
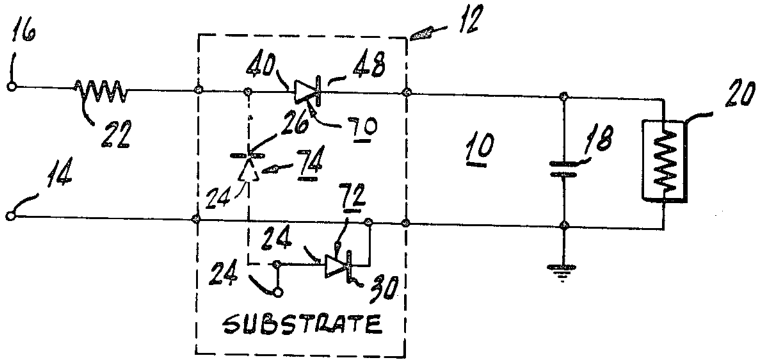

The invention will be more fully understood when reference is made to the accompanying drawings in which:

FIG. 1 is a cross section of a portion of a junction isolated integrated circuit according to one embodiment of the present invention; and FIG. 2 is a circuit diagram in conventional form of the circuit shown in FIG. 1.

Referring to FIG. 1, a portion is shown of a circuit 10 which includes a junction isolated integrated circuit chip 12 which may additionally include complex AC and DC processing circuitry (not shown). AC power, designated by the letters AC is applied from a suitable source (not shown) to terminals 14 and 16. If one considers terminal 14 as the reference terminal, the voltage at terminal 16 swings between a peak positive value and an equal peak negative value with respect to the reference. Terminal 14 is connected to one end of capacitor 18 and load 20 designated herein as a resistance $R_L$ but which may be any type of circuit requiring the application of a source of DC power and which may be included on chip 12. Input terminal 16 is connected to one end of an external resistance 22. Integrated circuit chip 12 is connected between the other end of resistor 22 and the other ends of capacitor 18 and load 20.

Integrated circuit chip 12 includes a P-type substrate 24 which has a diffused N+ region 26 therein. An epitaxial layer which includes a plurality of N-type regions 28, 30, 31 and 32 is epitaxially grown on substrate 24; during the epitaxial growth process region 26 also diffuses into region 28. The regions 28, 30, 31, 32 are isolated from one another by diffused P+ regions 34, 36, and 38 in conjunction with the substrate 24.

Region 28 has diffused therein a P region 40 and an N+ ring 42 which surrounds the P region 40 and a portion of N layer 28. Ring 42 is made in two steps such that the deep diffused portion thereof 44 is made first and goes as far down as N+ region 26, then a shallow diffused portion 46 is formed. P region 40 has an N+ region 48 diffused therein.

N region 30 has an N+ region 50 diffused therein. These epitaxial and diffused regions are formed on the substrate in a known manner which need not be described herein.

Metallization in the form of conductive strips (which may be formed by evaporation or plating of a suitable metal such as aluminum) 52, 54, and 56 is also provided. Conductive strip 52 is connected respectively to P region 40 and N+ ring region 42 such that the two regions are short circuited. Conductive strip 54 is connected to N+ region 48, and conductive strip 56 is connected to N+ region 50. Strips 52, 54, 56 are separated from each other and the remainder of chip 12 by an insulating layer (which may for example comprise silicon dioxide or silicon nitride) having portions 58, 60, 62, 64 and 66.

There is a connection between conductive strip 56 and the input terminal 14. The other end of resistor 22 is connected to conductive strip 52 and a connection is provided between the conductive strip 54 and the capacitor 18 and load 20.

FIG. 2 shows a circuit diagram in conventional form of the structure shown in FIG. 1 and, where possible, similar numbers have been used to designate similar components. In the integrated circuit chip 12, as shown by the dashed lines in FIG. 2, there are two diodes 70 and 72. Diode 70 is formed on integrated circuit chip 12 by the junction of P region 40 and N+ region 48. Diode 72 is formed on chip 12 by the junction of N region 30 and the P substrate 24, with the diode 72 so formed being connected to terminal 14 via strip 56 and N+ contact region 50. In addition, a diode 74, formed between substrate 24 and regions 26 and 28 is shown in dotted lines because it is not a part of the circuit design, but is inherent in the use of a back-biased junction isolated integrated circuit.

The operation of circuit 10 will now be explained. When terminal 16 is more positive than terminal 14, diode 70 conducts and capacitor 18 is charged up to a positive voltage. During this time, the substrate 24 is prevented from rising above the reference potential at terminal 14 by diode 72. However, when terminal 14 becomes more positive with respect to terminal 16, the most negative point of the circuit is no longer at reference potential but rather at the potential of terminal 16 that is, the potential at terminal 16 drops below reference potential.

If diode 72 were not present and substrate 24 was connected directly to the reference potential at terminal 14, diode 74, formed by substrate 24 and region 26 would conduct because the cathode (region 26) of diode 74 is negative with respect to the anode (substrate 24). This would result in the circuit being inoperative and may result in catastrophic failure. However, since diode 72 is present, the current flow through diode 74 is blocked, that is, the substrate is effectively isolated from the reference or "floating." Thus, for the positive half-cycle, substrate 24 is prevented from rising above the reference potential and for the negative half-cycle, it is "floating."

A further problem in any chip, in which a diode similar to diode 72 is present, is parasitic multilayer device action. This problem exists because substrate 24 is common to all epitaxial regions, such as regions 28, 30, 31 and 32. Where any active device is present in an epitaxial region, there may exist a parasitic multilayer device. One such device as shown by the dashed line in FIG. 1 could consist of P region 40, N region 28, P substrate 24 and N region 30 if metal strip 52 did not short circuit N+ ring 42 and P region 40 as would be the case in a transistor. For example, a four-layer device would also exist between N layer 30, P substrate and the collector and base of any transistor structure in the remainder of the chip (not shown in FIG. 1).

The presence of the box including N+ ring 42 and N+ region 26 prevents this parasitic four-layer device from acting as a controlled rectifier by decreasing the internal loop gain of the device to less than one. Thus N+ ring 42 and N+ region 26 must be of sufficient thickness to reduce this loop gain below one. Structure similar to the box which includes N+ ring 42 and N+ region 26 is described in U.S. Pat. No. 3,430,110.

Although the parastic controlled rectifier action just described may not in practice be present in the circuit of FIG. 1, the aforementioned box should be included to insure that it is not. Further, since other boxes similar to the box including N+ region 26 and N+ ring 42 will be diffused into the chip because of possible parastic multilayer device action due to the presence of the diode formed by N region 30 and substrate 24 and the other active devices (not shown) on the chip, it is preferable to include N+ ring 42 and N+ region 26 as shown.

What is claimed is:

1. A circuit having at least two input terminals between which a source of potential, the polarity of which may vary, is connectable and at least two output terminals for connection to a load, said circuit comprising:

a semiconductor substrate (24) of one conductivity type;

an epitaxial layer of a material having a conductivity type opposite to that of said substrate material and positioned adjacent said substrate, said epitaxial layer having a plurality of isolated regions of semiconductor material contained therein;

one of said isolated regions comprising a first zone (42) of said opposite conductivity type having a portion (26) thereof positioned adjacent said substrate (24) such that a first rectifying junction (74) is formed between said substrate (24) and said portion (26), a second zone (40) of a material of said one conductivity type positioned within said first zone (42), a third zone (48) of a material of said opposite conductivity type positioned with said second zone (40) such that a second rectifying junction (70) is formed therebetween, separate from said first rectifying junction (74), said first zone (42) and said second zone (40) being direct current conductively coupled to one of said input terminals (16), a direct current connection between said third zone (48) and one of said output terminals;

another of said isolated regions comprising another zone (30) of said opposite conductivity type positioned with respect to said substrate (24) such that a third rectifying junction (72) is formed therebetween, separate from said first and second rectifying junctions;

a connection between said other input terminal (14) and said other zone (30);

a connection between the other one (14) of said input terminals and the other one of said output terminals over a path separate from said first, second and third rectifying junctions;

said third rectifying junction (72) acting to maintain the potential of said substrate substantially at the potential of said other input terminal when said source is of a given polarity and to prevent said first rectifying junction (74) from conducting current when said source is of opposite polarity;

said first zone (42) and said portion (26) thereof forming a boxlike configuration with said second zone (40) and said third zone (48) being wholly within said boxlike configuration.

2. The circuit according to claim 1, wherein said first zone (42) is highly doped with conductivity determining impurities.

3. The circuit according to claim 2, wherein said third zone (48) is highly doped with conductivity determining impurities and of said opposite conductivity type.

4. The circuit according to claim 1, wherein said portion (26) of said first zone (42) and said second zone (40) are electrically interconnected by a conductive strip (52).

5. The circuit according to claim 4, wherein said conductive strip (52) is direct current connected through a resistor to said one input terminal (16).

* * * * *